(12) United States Patent
Kim (10) Patent No.: US 11,997,840 B2
(45) Date of Patent: May 28, 2024

(54) ELECTRONIC DEVICE

(71) Applicant: Sony Interactive Entertainment Inc., Tokyo (JP)

(72) Inventor: Sangwoo Kim, Kanagawa (JP)

(73) Assignee: Sony Interactive Entertainment Inc., Tokyo (JP)

( * ) Notice: Subject to any disclaimer, the term of this patent is extended or adjusted under 35 U.S.C. 154(b) by 53 days.

(21) Appl. No.: 17/616,319

(22) PCT Filed: Jun. 9, 2020

(86) PCT No.: PCT/JP2020/022661
§ 371 (c)(1),
(2) Date: Dec. 3, 2021

(87) PCT Pub. No.: WO2020/255790
PCT Pub. Date: Dec. 24, 2020

(65) Prior Publication Data
US 2022/0322584 A1 Oct. 6, 2022

(30) Foreign Application Priority Data

Jun. 17, 2019 (JP) ................................ 2019-112277

(51) Int. Cl.
*H05K 9/00* (2006.01)
*G06F 1/16* (2006.01)

(52) U.S. Cl.
CPC ..................... *H05K 9/00* (2013.01)

(58) Field of Classification Search
CPC .... H05K 9/00; H05K 9/0033; H05K 7/20436; H01Q 1/526; G06F 1/1605; G06F 1/1626; G06F 1/1635; G06F 1/1656; G06F 1/1658; G06F 1/1698; G06F 1/203
See application file for complete search history.

(56) References Cited

U.S. PATENT DOCUMENTS

| | | | | |
|---|---|---|---|---|
| 4,910,434 | A | * | 3/1990 | Doumani ................ G06F 1/182 315/32 |
| 5,436,803 | A | * | 7/1995 | Annis ................. H05K 9/0043 174/382 |
| 5,557,064 | A | * | 9/1996 | Isern-Flecha .......... H05K 3/284 174/378 |

(Continued)

FOREIGN PATENT DOCUMENTS

| JP | 69112973 U | 7/1984 |
|---|---|---|
| JP | 10229289 A | 8/1998 |

(Continued)

OTHER PUBLICATIONS

International Search Report for corresponding PCT Application No. PCT/JP2020/022661, 4 pages, dated Aug. 25, 2020.

*Primary Examiner* — Abhishek M Rathod
(74) *Attorney, Agent, or Firm* — Matthew B. Dernier, Esq.

(57) ABSTRACT

An electronic device includes a printed board having an electronic part mounted on a surface thereof and a shield member arranged so as to be opposite to the surface of the printed board and to cover the electronic part. The shield member has a protruding portion that extends to the outer side beyond one end of the printed board as viewed in top plan, and the protruding portion is bent to the printed board side and has a tip end extending at least to a position opposite to a side face of the printed board.

3 Claims, 7 Drawing Sheets

(56) References Cited

U.S. PATENT DOCUMENTS

| | | | | |
|---|---|---|---|---|
| 6,134,121 A * | 10/2000 | Braxton | ............... | H04M 1/0277 |
| | | | | 361/818 |
| 6,137,051 A * | 10/2000 | Bundza | ................ | H05K 9/0073 |
| | | | | 361/752 |
| 7,196,275 B2 * | 3/2007 | Babb | .................... | H05K 9/0039 |
| | | | | 174/382 |
| 7,202,422 B2 * | 4/2007 | Ogatsu | ................. | H05K 9/0039 |
| | | | | 174/373 |
| 10,652,996 B2 * | 5/2020 | Chiu | ....................... | H05K 9/003 |
| 10,908,651 B2 * | 2/2021 | Honma | ................. | G06F 1/1656 |
| 2003/0128535 A1 * | 7/2003 | Otani | ................... | H05K 9/0018 |
| | | | | 361/816 |
| 2011/0294498 A1 * | 12/2011 | Le Sage | ............... | H04B 17/102 |
| | | | | 455/422.1 |
| 2015/0015450 A1 * | 1/2015 | Kirita | ................... | H05K 9/0052 |
| | | | | 343/841 |
| 2015/0062826 A1 * | 3/2015 | Lin | .................... | H05K 7/20436 |
| | | | | 361/720 |
| 2019/0391052 A1 * | 12/2019 | Lavrovsky | ............... | F24F 11/30 |

FOREIGN PATENT DOCUMENTS

| | | | |
|---|---|---|---|
| JP | 2002344172 A | | 11/2002 |
| JP | 2008005461 A | | 1/2008 |
| JP | 2018060991 A | | 4/2018 |

\* cited by examiner

ELECTRONIC DEVICE

TECHNICAL FIELD

The present invention relates to an electronic device in which a printed board is built.

BACKGROUND ART

Generally, an electronic device has built therein a printed board on which various electronic parts are mounted. Some of such electronic parts generate an electromagnetic field that acts as noise that has an influence on operation of some other electronic parts, wireless communication, and so forth. In order to prevent propagation of such noise as just described, a circuit element that acts as a generation source of noise is covered with a shield member formed from a metal plate or the like.

SUMMARY

Technical Problem

In the technology described above, it is difficult to have the shield member be in full contact with the printed board, and there is a possibility of noise propagating from a gap between the shield member and the printed board.

The present invention has been made in view of such a situation as described above, and it is an object of the present invention to provide an electronic device capable of effectively suppressing, by a shield member, noise generated from a circuit element arranged on a printed board.

Solution to Problem

An electronic device according to one mode of the present invention includes a printed board having an electronic part mounted on a surface thereof; and a shield member arranged so as to be opposite to the surface of the printed board and to cover the electronic part. In the electronic device, the shield member has a protruding portion that extends to an outer side beyond one end of the printed board as viewed in top plan, and the protruding portion is bent to the printed board side and has a tip end extending at least to a position opposite to a side face of the printed board.

DESCRIPTION OF EMBODIMENT

In the following, an embodiment of the present invention is described in detail with reference to the drawings.

Figure 1:
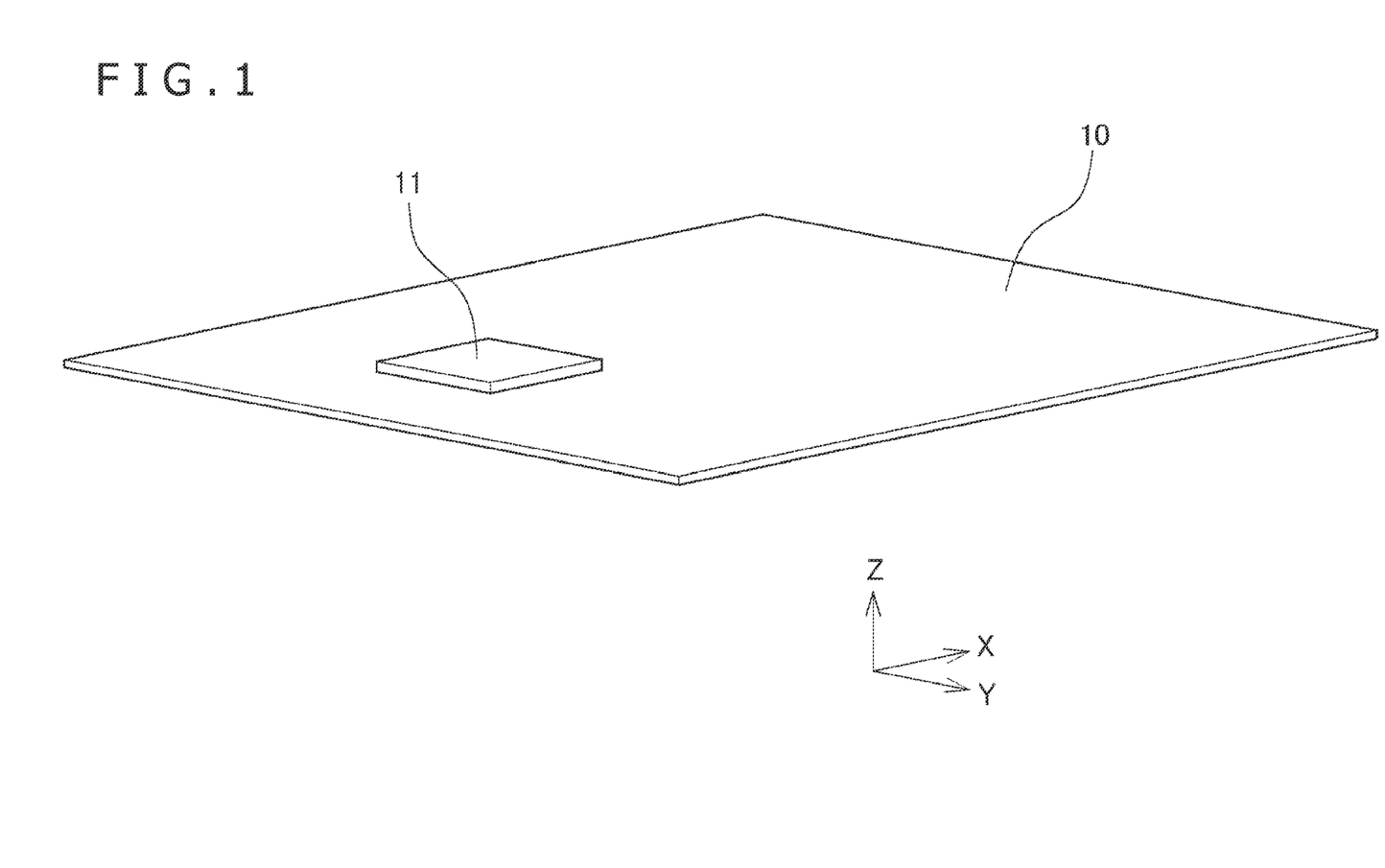
FIG. 1 is a perspective view depicting a printed board to be built in an electronic device according to an embodiment of the present invention.
Figure 2:
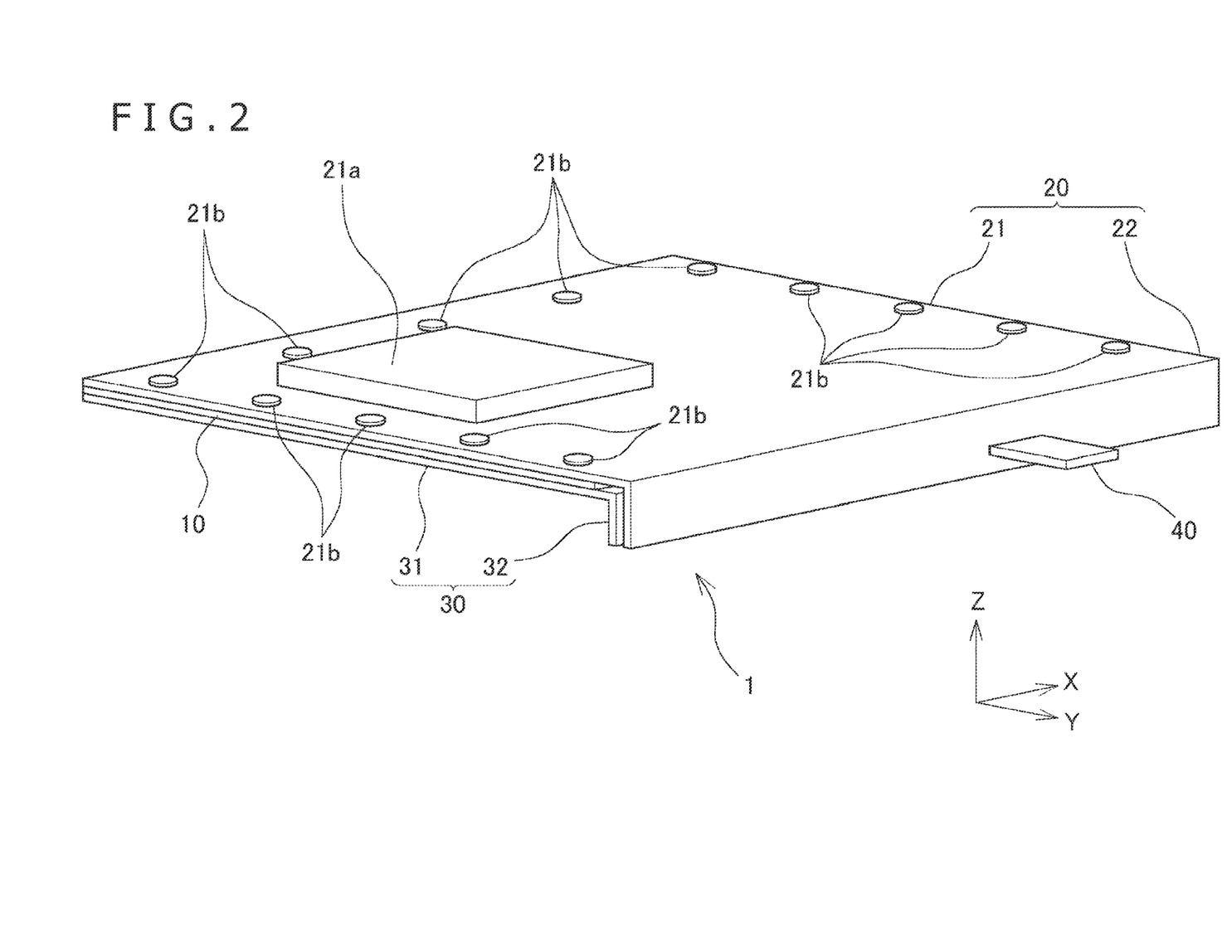
FIG. 2 is a perspective view depicting the printed board in a state in which a shield member is attached.
Figure 3:
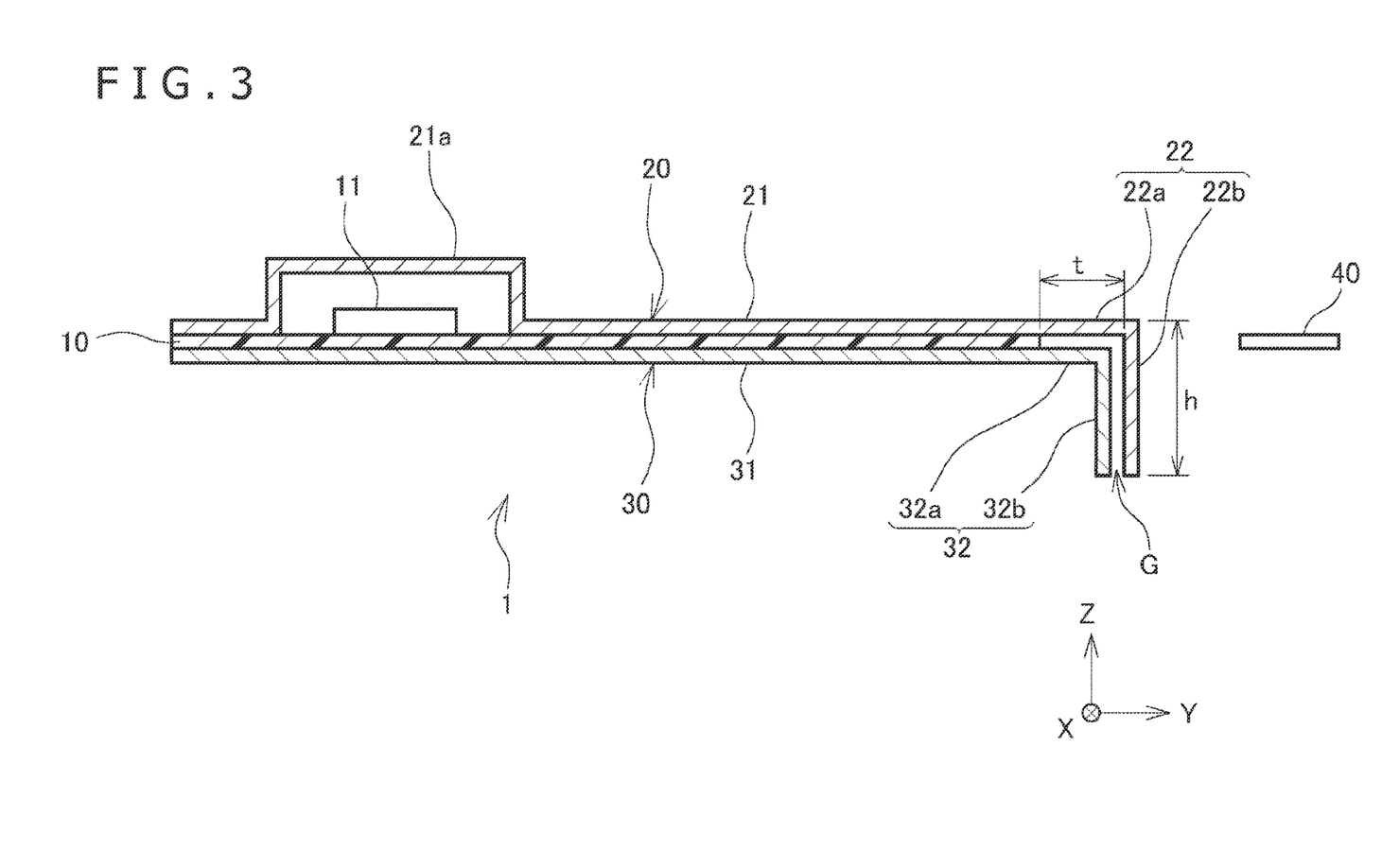
FIG. 3 is a cross sectional view of the printed board in the state in which the shield member is attached.

An electronic device 1 according to one embodiment of the present invention is, for example, a home game machine or the like and includes a printed board (printed wiring board) 10 on which various electronic parts are mounted and a front side shield member 20, a rear side shield member 30, and an antenna 40 that are attached to the printed board 10. FIG. 1 is a perspective view depicting an appearance of the surface of the printed board 10 in a state before the front side shield member 20 and the rear side shield member 30 are attached. FIG. 2 is a perspective view depicting an appearance of the surface of the printed board 10 in a state in which the front side shield member 20 and the rear side shield member 30 are attached. Further, FIG. 3 is a partial cross sectional view depicting a positional relation in the printed board 10 in a state where the front side shield member 20 and the rear side shield member 30 are attached thereto as viewed from a side.

At least one electronic part 11 that acts as a generation source of noise is arranged on the surface of the printed board 10. Although only one electronic part 11 arranged on the surface side of the printed board 10 is depicted in FIG. 1, a plurality of electronic parts may be arranged on the surface of the printed board 10. Further, the printed board 10 may be a double-sided printed board, and one or a plurality of electronic parts may be arranged also on a rear face side.

The front side shield member 20 and the rear side shield member 30 are members for shielding electromagnetic waves that are radiated from the printed board 10 and the electronic parts arranged on the printed board 10 and that act as noise, and are formed from an electric conductive member such as a metal plate. The front side shield member 20 is arranged so as to be opposite to the surface of the printed board 10 and to cover the electronic part 11, and is fixed to the printed board 10. Further, the rear side shield member 30 is arranged so as to be opposite to the rear face of the printed board 10 and is fixed to the printed board 10. The structure of the shield members is described later in detail.

The antenna 40 is an electric conductor used for transmission and reception of a wireless signal, and the electronic device 1 performs wireless communication with external communication devices through the antenna 40. In the following description, the frequency used for wireless communication by the antenna 40 is referred to as a communication frequency. The antenna 40 is arranged at a position spaced in a predetermined direction as viewed from the printed board 10. In particular, the antenna 40 is arranged at a position where the antenna 40 does not overlap with the printed board 10 as viewed in top plan. It is to be noted here that viewing in a direction perpendicular to the surface of the printed board 10 from the surface side of the printed board 10 is referred to as viewed in top plan.

In the following description, the side on which the antenna 40 is arranged as viewed from the printed board 10 is referred to as a front face side of the electronic device 1. Further, in the following description, for the convenience of description, it is assumed that the direction that is parallel to the surface of the printed board 10 and in which the printed board 10 and the antenna 40 are lined up (forward and rearward direction of the electronic device 1) is a Y-axis direction; the direction that is parallel to the surface of the printed board 10 and is orthogonal to the Y-axis direction (leftward and rightward direction of the electronic device 1) is an X-axis direction; and the thicknesswise direction of the printed board 10 (upward and downward direction of the electronic device 1) is a Z-axis direction. Further, it is assumed that the rightward direction when the electronic device 1 is viewed from the front face side is an X-axis positive direction; the direction from the printed board 10 toward the antenna 40 is a Y-axis positive direction; and the direction from the rear face toward the surface of the printed board 10 is a Z-axis positive direction.

In the present embodiment, it is assumed that especially the electronic part 11 radiates noise within a frequency band overlapping with the communication frequency of the antenna 40. Thus, it is necessary to use a shield member to shield noise such that wireless communication by the antenna 40 is not disturbed by noise radiated from the electronic part 11. In order to shield noise radiated from the electronic part 11 to the antenna 40 side, in the present embodiment, a protruding portion that protrudes from one end of the printed board 10 is provided at one end of the front side shield member 20 on the antenna 40 side such that noise is shielded by the protruding portion. The structure of the front side shield member 20 that implements such an action as just described is described below.

In particular, the front side shield member 20 has a rectangular shape overlapping with the printed board 10 as viewed in top plan, and a portion that protrudes beyond one end of the printed board 10 is provided at one end of the front side shield member 20 on the Y-axis positive direction side (antenna 40 side). In the following description, of the front side shield member 20, a portion overlapping with the printed board 10 as viewed in top plan is referred to as a main body portion 21 and another portion protruding from the main body portion 21 to the Y-axis positive direction side is referred to as a protruding portion 22.

The main body portion 21 includes a projecting portion 21*a* formed in a projecting shape to the Z-axis positive direction side and in a recessed shape to the Z-axis negative direction side, and the projecting portion 21*a* covers the electronic part 11. Further, the front side shield member 20 is fastened to the printed board 10 at a plurality of positions along an outer periphery of the main body portion 21 by screws 21*b*. It is to be noted that, as described in detail later, the main body portion 21 is screwed to the printed board 10 along three edges thereof except one edge on the Y-axis positive direction side (antenna 40 side).

The protruding portion 22 extends in the Y-axis positive direction to a position between the printed board 10 and the antenna 40 as viewed in top plan and is shaped such that a tip end portion thereof is bent to the Z-axis negative direction (printed board 10 side). In particular, the protruding portion 22 includes an extending portion 22*a* extending in the Y-axis positive direction substantially in parallel to the surface of the printed board 10 and a shielding portion 22*b* extending in the Z-axis negative direction substantially orthogonal to the surface of the printed board 10. Further, an upper end of the shielding portion 22*b* is connected to a tip end of the extending portion 22*a* such that the protruding portion 22 as a whole has an L shape as viewed in side elevation (in the X-axis direction) with the tip end thereof bent to the printed board 10 side.

The shielding portion 22*b* extends at least to a position where the shielding portion 22*b* overlaps with the side face of the printed board 10 as viewed from the front face side of the electronic device 1. Consequently, the shielding portion 22*b* is opposite, at a portion thereof, to the side face of the printed board 10 on the Y-axis positive direction side. A tip end portion of the shielding portion 22*b* does not contact with any of the printed board 10 and the rear side shield member 30. However, since the shielding portion 22*b* extends at least to the position opposite to the side face of the printed board 10, the front side shield member 20 functions as a barrier for separating the printed board 10 and the antenna 40 from each other and can thereby shield noise radiated from the electronic part 11 such that the noise does not reach the antenna 40.

Further, in the present embodiment, also the rear side shield member 30 includes a main body portion 31 overlapping with the printed board 10 as viewed in top plan and a protruding portion 32 protruding to the Y-axis positive direction side with respect to the printed board 10. Moreover, the protruding portion 32 of the rear side shield member 30 includes an extending portion 32*a* extending in the Y-axis positive direction substantially in parallel to the rear face of the printed board 10 and a tip end portion 32*b* extending in the Z-axis negative direction substantially orthogonal to the rear face of the printed board 10 and having an upper end connected to the extending portion 32*a*. Further, the protruding portion 32 is arranged such that the extending portion 32*a* thereof is opposite to and extends in parallel to the extending portion 22*a* of the front side shield member 20 and that the tip end portion 32*b* thereof is opposite to and extends in parallel to the shielding portion 22*b* of the front side shield member 20. Since the protruding portion 22 and the protruding portion 32 are opposite to each other in the manner described above, a space of an L shape as viewed from the X-axis direction is formed between them. In the following description, the L-shaped space is referred to as a waveguide portion G. The waveguide portion G functions as a guide that guides noise that propagates from the electronic part 11, along a route so as to change the direction of the noise. In particular, where the noise propagates along the waveguide portion G, the direction of the noise radiated from the electronic part 11 to the antenna 40 side is changed to the Z-axis negative direction side. Consequently, the noise from the electronic part 11 becomes less likely to have an influence on the antenna 40.

Figure 4:
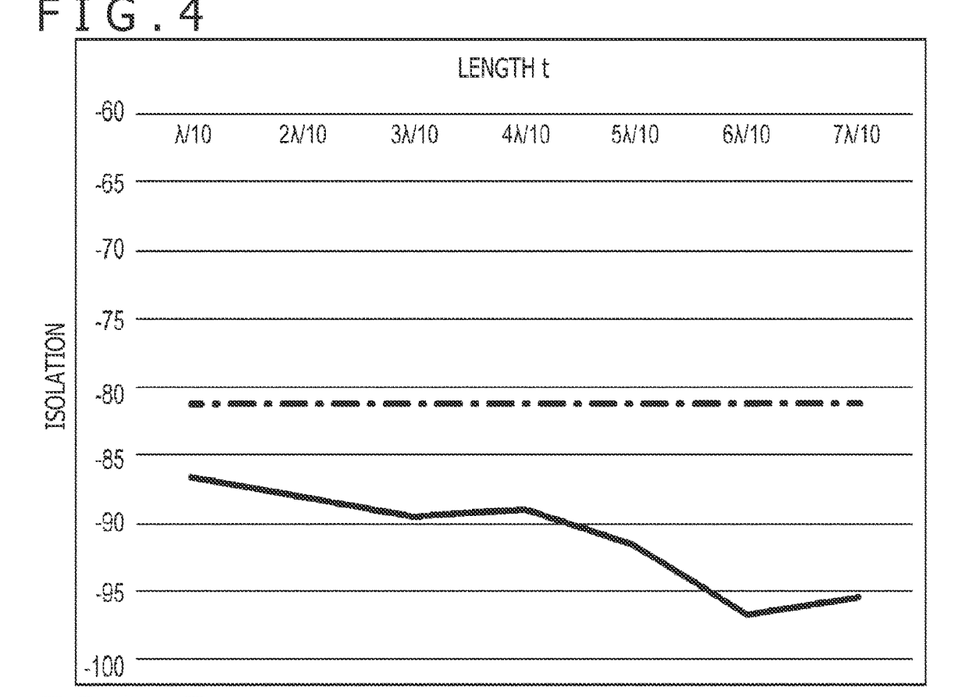
FIG. 4 is a graph depicting a variation of isolation in a case where the length of an extending portion is changed.
Figure 5:
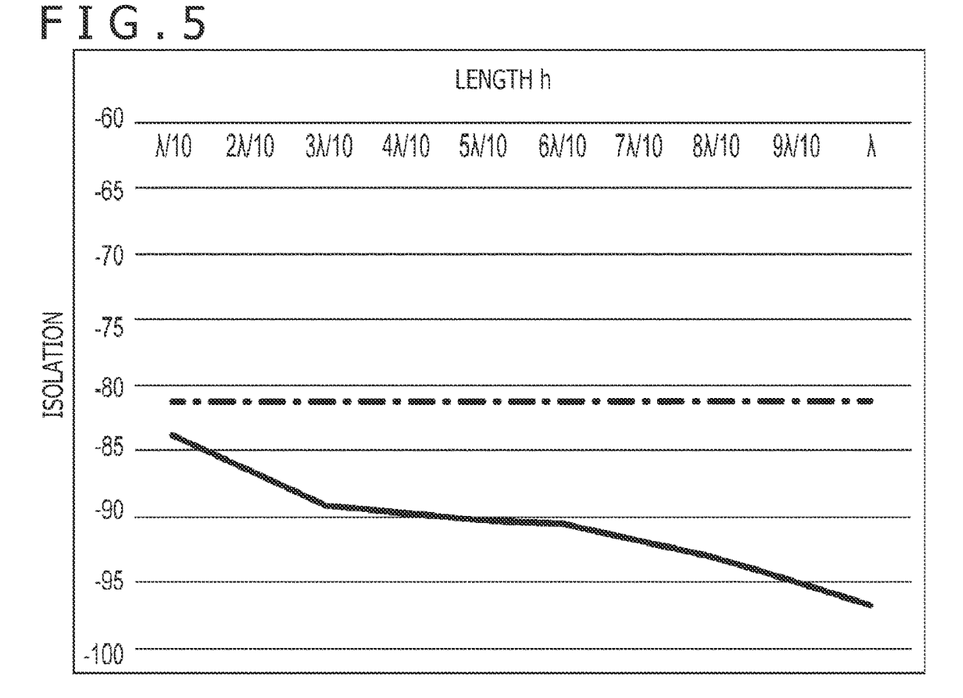
FIG. 5 is a graph depicting a variation of isolation in a case where the length of a shielding portion is changed.

In order to reduce the influence on the antenna 40 from the electronic part 11, preferably the length of the waveguide portion G is increased. In particular, the inventors of the invention of the present application confirmed through a simulation that, in a case where the length of the extending portion 22*a* is represented by t and the length of the shielding portion 22*b* is represented by h, increasing each of the lengths t and h decreases the isolation (index value indicative of the influence of noise) between the electronic part 11 and the antenna 40. FIGS. 4 and 5 are graphs indicative of results of the simulation of isolation between the electronic part 11 and the antenna 40 in a case where the length t of the extending portion 22*a* and the length h of the shielding portion 22*b* are each changed. It is to be noted that the lengths of the portions in the graphs are indicated in a unit of the wavelength λ corresponding to the communication frequency of the antenna 40. Further, dot-dash lines in the graphs indicate values of the isolation in the case where the protruding portion 22 and the protruding portion 32 are not provided. As depicted in the figures, increasing the lengths t and h improves the isolation. Especially, where the lengths t and h are each made equal to or greater than $3/10\lambda$, a significant improvement effect is obtained in comparison with that in the case where the protruding portion 22 and the protruding portion 32 are not provided.

Further, where such a protruding portion 22 as described above is provided on the front side shield member 20, noise propagation to the antenna 40 side can be prevented even if an edge of the main body portion 21 on the side on which the protruding portion 22 is provided (on the Y-axis positive direction side) is not screwed to the printed board 10. The inventors of the invention of the present application confirmed, through the simulation, the difference in isolation between the electronic part 11 and the antenna 40 in regard to both the case in which the edge of the main body portion 21 on the Y-axis positive direction side is screwed to the printed board 10 and another case in which the edge is not screwed to the printed board 10. As a result, it was found that there is little deterioration of the isolation in the case where the edge of the main body portion 21 is not screwed to the printed board 10 in comparison with that in the case where the edge of the main body portion 21 is screwed to the printed board 10. In other words, in the electronic device 1 according to the present embodiment, the provision of the protruding portion 22 eliminates the necessity for screwing the edge on the protruding portion 22 side to the printed board 10, and screwing locations can be reduced.

As described above, with the electronic device 1 according to the present embodiment, since the protruding portion 22 is provided on the front side shield member 20, it is possible to prevent, without screwing the edge of the front side shield member 20 on the antenna 40 side to the printed board 10, noise propagation from the inside of the front side shield member 20 to the antenna 40 side and thereby secure isolation between the electronic part 11 and the antenna 40.

It is to be noted that the embodiment of the present invention is not limited to that described above. For example, the protruding portion 22 of the front side shield member 20 may be configured in various shapes having an opposite portion that is opposite to a side face of the printed board 10. In the following description, several modifications of the embodiment of the present invention are described.

Figure 6:
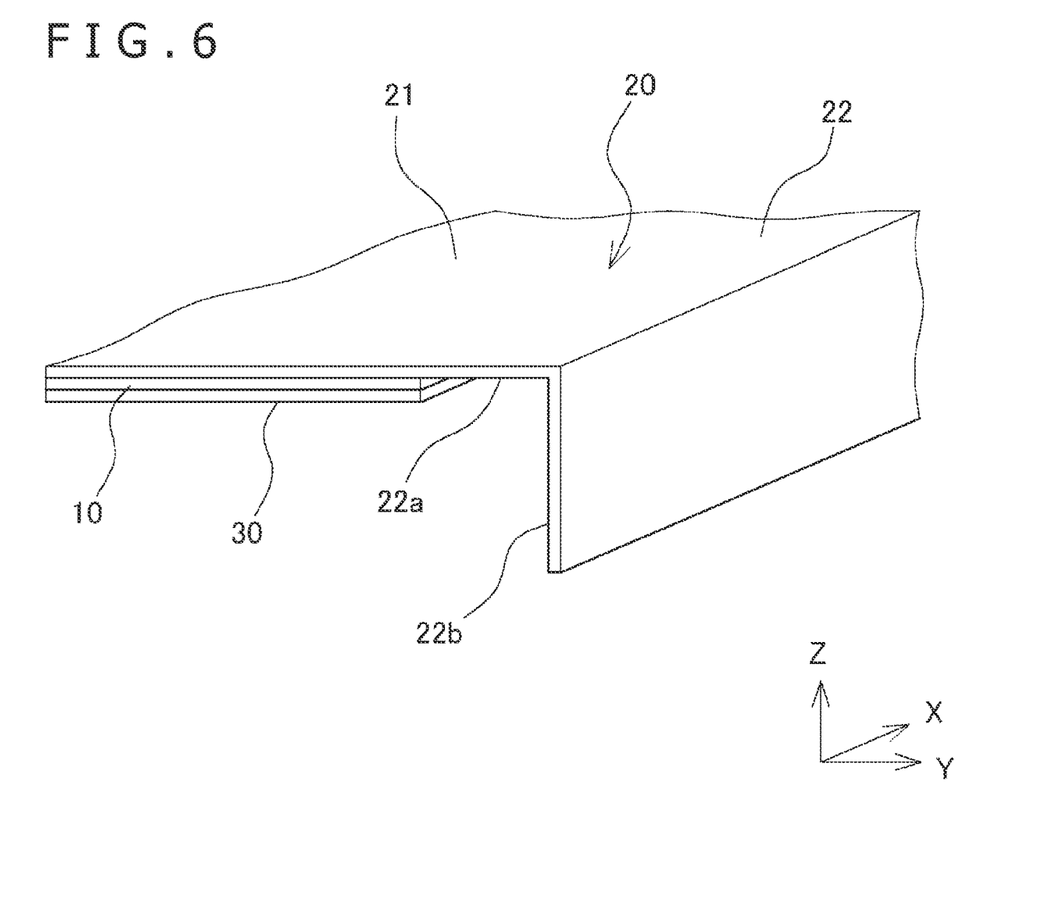
FIG. 6 is a view depicting a shape of the shield member in an electronic device according to a first modification.

FIG. 6 is a partial enlarged view depicting a shape of the front side shield member 20 and the rear side shield member 30 in an electronic device according to a first modification. In the present first modification, in comparison with the embodiment depicted in FIGS. 2 and 3, the front side shield member 20 has a substantially equivalent protruding portion 22. However, the rear side shield member 30 does not have the protruding portion 32. Also in this case, noise propagated from the electronic part 11 is shielded to some degree by the protruding portion 22, and the influence of noise upon the antenna 40 can be reduced.

Figure 7:
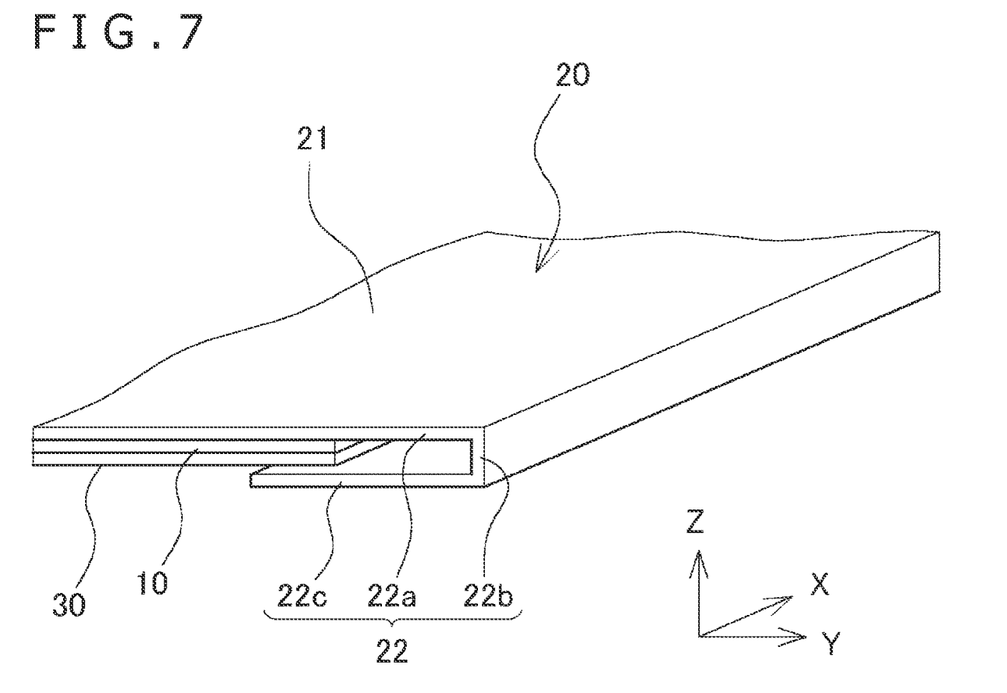
FIG. 7 is a view depicting a shape of the shield member in an electronic device according to a second modification.

FIG. 7 is a partial enlarged view depicting a shape of the front side shield member 20 and the rear side shield member 30 in an electronic device according to a second modification. In this second modification, the rear side shield member 30 does not have the protruding portion 32 similarly as in the first modification. On the other hand, the protruding portion 22 of the front side shield member 20 first extends in the Y-axis positive direction from the main body portion 21, is then bent there to extend in the Z-axis negative direction, and is further bent to extend in the Y-axis negative direction. In particular, the protruding portion 22 includes an extending portion 22a extending in the Y-axis positive direction, a shielding portion 22b extending in the Z-axis negative direction and being opposite to a side face of the printed board 10, and a tip end portion 22c extending in the Y-axis negative direction. The tip end portion 22c is connected, at a base end thereof, to a tip end of the shielding portion 22b but is not connected, at a tip end thereof, to any other member. Further, the tip end portion 22c is arranged in parallel to an end portion of the rear side shield member 30 on the Y-axis positive direction side and is opposite to the rear side shield member 30 with a space of a predetermined distance left therebetween. Consequently, noise radiated from the electronic part 11 goes round the side face of the printed board 10 until it is guided to the rear face side of the printed board 10, and is thus less likely to have an influence on the antenna 40.

Figure 8:
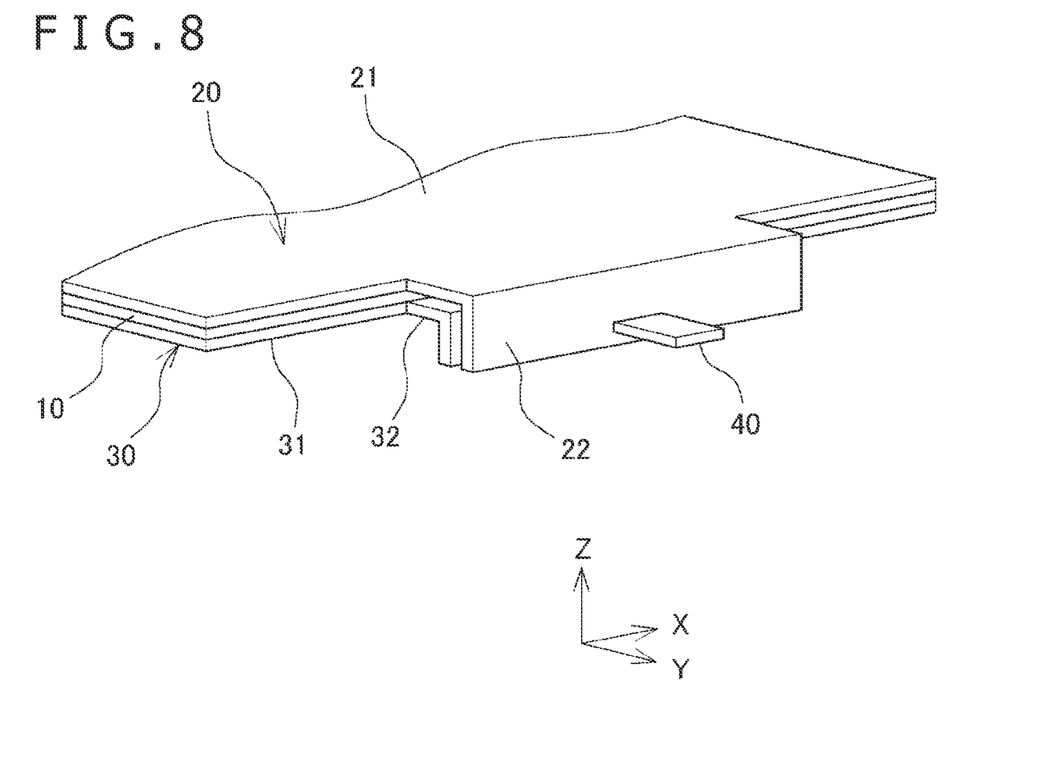
FIG. 8 is a view depicting a shape of the shield member in an electronic device according to a third modification.

FIG. 8 is a partial enlarged view depicting a shape of the front side shield member 20 and the rear side shield member 30 in an electronic device according to a third modification. In the examples described so far, the protruding portion 22 has a width (width in the X-axis direction) substantially equal to that of the main body portion 21 and is formed such that it shields the entire side face of the printed board 10 on the Y-axis positive direction side. However, in the present third modification, the protruding portion 22 has a width smaller than the width of the main body portion 21. Further, also the protruding portion 32 of the rear side shield member 30 has a width substantially equal to the width of the protruding portion 22 and is arranged so as to be opposite to the protruding portion 22.

In the present third modification, the protruding portion 22 is formed such that at least the range of the protruding portion 22 along the X-axis direction includes the position of the antenna 40 and includes a range of a predetermined length in each of the X-axis positive direction and the X-axis negative direction from the antenna 40. This predetermined length is a length equivalent to the wavelength $\lambda$ corresponding to the communication frequency of the antenna 40. In particular, in a case where the position of the antenna 40 in the X-axis direction is the position of the center of the protruding portion 22 in the widthwise direction, the width of the protruding portion 22 is preferably equal to or greater than at least the total length $(w+2\lambda)$ of a width w of the antenna 40 in the X-axis direction and lengths $\lambda$ of the left and right portions of the protruding portion 22 with respect to the antenna 40.

It is to be noted that, in the third modification, of an end portion of the main body portion 21 on the Y-axis positive direction side, at places where the protruding portion 22 is not provided, the side face of the printed board 10 is open without being shielded. If also this portion is covered with an electric conductor, then the noise shielding effect can be increased. Further, if also the side faces of the waveguide portion G formed with the protruding portion 22 and the protruding portion 32 opposite to each other (faces on the X-axis positive direction side and the X-axis negative direction side) are closed up with an electric conductor similarly, then the noise shielding effect can be increased.

REFERENCE SIGNS LIST

1: Electronic device
10: Printed board
11: Electronic part
20: Front side shield member
21: Main body portion
21a: Projecting portion
21b: Screw
22: Protruding portion
22a: Extending portion
22b: Shielding portion
30: Rear side shield member
31: Main body portion
32: Protruding portion
32a: Extending portion
32b: Opposite portion
40: Antenna.

The invention claimed is:
1. An electronic device comprising:
a printed board having first and second opposing surfaces, and an electronic part mounted on the first surface thereof;

a first shield member disposed on and covering the first surface of the printed board, wherein the first shield member has:

a main body portion extending substantially parallel to and in contact with the first surface of the printed board, a cavity portion that projects away from and out of contact with the first surface of the printed board to form a volume within which the electronic part is disposed, and a protruding portion that extends beyond contacting one end of the first surface of the printed board as viewed in top plan, by a length (t); and a second shield member disposed on and covering the second surface of the printed board, wherein the second shield member has a further protruding portion extending beyond contacting the one end of the second surface of the printed board as viewed in top plan, by the length (t), wherein the protruding portion and the further protruding portion are bent transversely with respect to a plane defined by both the printed circuit board, extend by a length (h) and beyond a side edge of the printed circuit board, and remain separated from one another to form a waveguide through the lengths (t) and (h).

2. The electronic device according to claim 1, wherein the protruding portion of the first shield member is further bent, at a position beyond the position opposite to the side edge of the printed board, to a side approaching the printed board, and the bent portion is opposite to an outer surface of the second shield member.

3. The electronic device according to claim 1, wherein
an antenna is arranged at a position where the antenna does not overlap with the printed board as viewed in top plan and is spaced away to the side of the one end of the printed board, and the protruding portion of the first shield member is bent to the printed board side at a position between the one end of the printed board and the antenna.

\* \* \* \* \*